(12) United States Patent
Moriya

(10) Patent No.: US 7,538,627 B2
(45) Date of Patent: May 26, 2009

(54) SURFACE MOUNT CRYSTAL OSCILLATOR

(75) Inventor: Kouichi Moriya, Saitama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 107 days.

(21) Appl. No.: 11/724,528

(22) Filed: Mar. 15, 2007

(65) Prior Publication Data
US 2007/0229177 A1 Oct. 4, 2007

(30) Foreign Application Priority Data
Mar. 17, 2006 (JP) .............................. 2006-074924

(51) Int. Cl.
H03B 5/32 (2006.01)
H01L 41/053 (2006.01)

(52) U.S. Cl. ..................... 331/68; 331/108 C; 331/158; 310/349; 310/351

(58) Field of Classification Search .................. 331/68, 331/108 C, 158; 310/311, 346, 349, 351
See application file for complete search history.

(56) References Cited

U.S. PATENT DOCUMENTS 5,949,294 A * 9/1999 Kondo et al. ................... 331/68
6,587,008 B2 * 7/2003 Hatanaka et al. .............. 331/68
6,720,837 B2 4/2004 Moriya et al.
2004/0085147 A1 5/2004 Harima et al.

* cited by examiner

Primary Examiner—Robert Pascal
Assistant Examiner—Levi Gannon
(74) Attorney, Agent, or Firm—Muirhead and Saturnelli, LLC

(57) ABSTRACT

A surface mount crystal oscillator has a package body having a recess and formed with a step on an inner wall of the recess, a flat base plate having a peripheral region secured to the step, a crystal blank secured to the flat base plate, an IC chip having an oscillation circuit, using the crystal blank, integrated therein, and secured to a bottom surface of the recess, and a cover for closing the recess. The crystal blank is disposed above the IC chip within the recess, and the IC chip and the crystal blank are hermetically sealed within the recess.

2 Claims, 4 Drawing Sheets

SURFACE MOUNT CRYSTAL OSCILLATOR

BACKGROUND OF THE INVENTION

1. Field of the Invention

The present invention relates to a surface mount crystal oscillator, and more particularly, to a surface mount crystal oscillator which lends itself to improving the productivity.

2. Description of the Related Arts

A surface mount crystal oscillator has a quartz crystal blank and an IC chip that has integrated therein an oscillation circuit using the crystal blank, both of which are contained in a package of a surface mount type. Such crystal oscillators are built in a variety of portable electronic devices in particular as reference sources for frequency and time because of their small sizes and light weights. The crystal oscillators may be classified, according to how the crystal blank and IC chip are contained therein, into a bonding type crystal oscillator which has an IC chip and a crystal oscillator contained in separate packages which are then bonded for integration, and a one-chamber type crystal oscillator which contains an IC chip and a crystal oscillator in a single recess formed in a package. An example of the bonding type crystal oscillator is disclosed in US 2004/0085147A, while an example of the one-chamber type crystal oscillator is disclosed in U.S. Pat. No. 6,720,837.

FIG. 1 illustrates a conventional bonding type surface mount crystal oscillator. Mounting substrate 2 having a recess in which IC chip 1 is contained is bonded to a bottom surface of crystal unit 3 in which crystal blank 8 is hermetically sealed. Mounting substrate 2 is formed of laminated ceramics such that the recess can be formed in one main surface thereof, and has a substantially rectangular outer planar shape. At four corners of one main surface of mounting substrate 2, that is, the four corners of an open end surface surrounding the recess, bonding terminals 5 are formed for electric and mechanical connection with crystal unit 3. Also, at four corners of the other main surface of mounting substrate 2, mounting terminals 4 are formed for use in surface-mounting the crystal oscillator on a wiring board.

IC chip 1 has electronic circuits integrated on a semiconductor substrate, where the electronic circuits include an oscillation circuit which uses crystal unit 3, and a temperature compensation mechanism for compensating crystal unit 3 for frequency-temperature characteristics. The oscillation circuit and temperature compensation mechanism are formed on one main surface of the semiconductor substrate by a general semiconductor device fabrication process. Accordingly, a circuit forming surface will herein refer to one of the two main surfaces of IC chip 1 on which the oscillation circuit and temperature compensation mechanism are formed. A plurality of IC terminals are also formed on the circuit forming surface for connecting IC chip 1 to external circuits. The IC terminals include a power supply terminal, a ground terminal, an oscillation output terminal, a pair of connection terminals for connection with the crystal blank, and the like.

Circuit terminals are provided on the bottom surface of the recess in mounting substrate 2 in correspondence to the IC terminals. The circuit terminals corresponding to the power supply terminal, ground terminal, and oscillation output terminal on the IC chip are electrically connected to mounting terminals 4 through conductive paths, not show. Circuit terminals corresponding to a pair of connection terminal of IC chip 2 are electrically connected to bonding terminals 5 through conductive paths, not shown. IC chip 1 is secured to the bottom surface of mounting substrate 2 by electrically and mechanically connecting the IC terminals to the circuit terminals through ultrasonic thermo-compression bonding using bumps 6 such that the circuit forming surface faces the bottom surface of the recess in mounting substrate 2. Then, a protection resin layer is provided within the recess of mounting substrate 2 as a so-called under-fill to fill in a space between the recess and circuit forming surface of IC chip 1 for purposes of protecting the circuit forming surface. Since bonding type crystal oscillator has a crevice which intervenes between mounting substrate 2 and crystal unit 3, external air tends to introduce into the recess of mounting surface 2, so that the under-fill is required to protect the circuit forming surface.

Crystal unit 3 in turn comprises crystal blank 8 contained in package body 7 which has a recess and is formed of laminated ceramics, and metal cover 9 bonded to an open end surface surrounding the recess to hermetically seal crystal blank 8 within the recess. In this event, metal cover 9 is bonded, through seam welding or beam welding, to a metal thick film or metal ring 14 which is disposed on the open end such that it surrounds the recess. At four corners on the outer bottom surface of package body 7, external terminals 10 are disposed in correspondence to bonding terminals 5 on mounting substrate 2. A pair of crystal holding terminals 12 are disposed on the bottom surface of the recess in package body 7 for holding crystal blank 8.

As illustrated in FIG. 2, crystal blank 8, which comprises, for example, a substantially rectangular AT-cut quartz crystal blank, is provided with excitation electrodes 5a on both main surfaces, respectively. From these excitation electrodes 5a, lead-out electrodes 11b are extended toward both ends of one side of crystal blank 8, respectively. Crystal blank 8 is secured to crystal holding terminals 12 with conductive adhesive 13 or the like at both ends of the one side thereof to which lead-out electrodes 11b are extended, thereby electrically and mechanically connecting crystal blank 8 to crystal holding terminals 12 to hold crystal blank 8 within the recess of package body 7.

In package body 7, a pair of crystal holding terminals 12 are electrically connected to a pair of external terminals 10, which are positioned on one diagonal on the outer bottom surface of package body 7, through conductive paths, not shown. External terminals 10 positioned on the other diagonal on the outer bottom surface of package body 7 are electrically connected to metal cover 9 through via holes or the like extended through package body 7.

Then, bonding terminals 5 of mounting substrate 2 are connected to external terminals 10 of crystal unit 3 using soldering or the like to connect mounting substrate 2 with crystal unit 3, thereby completing a crystal oscillator. In this event, crystal holding terminal 12 in crystal unit 3 are electrically connected to the IC terminals through external terminals 10, bonding terminal 5, and circuit terminals, causing crystal blank 8 to electrically connect to the oscillation circuit within IC chip 1.

The bonding type crystal oscillator is fabricated by independently forming mounting substrate 2 mounted with IC chip 1 and crystal unit 3, and then bonding both components. As such, if a defect is found, for example, in the crystal unit itself, the defective crystal unit can be discarded before it is bonded to mounting substrate 2, to avoid consuming expensive IC chips for nothing. Consequently, the bonding type crystal oscillator lends itself to improving the productivity.

FIG. 3 illustrates a conventional one-chamber type surface mount crystal oscillator IC chip 1 and crystal blank 8 are contained within a single recess of package body 7, and metal cover 9 is bonded to an open end surface surrounding the recess to hermetically seal IC chip 1 and crystal blank 8 within the recess. IC chip 1 and crystal blank 8 used herein are similar to those of the aforementioned bonding type one.

Package body 7 is formed of laminated ceramics and has a substantially rectangular outer shape, and has the recess formed in one main surface thereof, in a manner similar to the foregoing, but differs from the bonding type one in that a step is formed on an inner wall of the recess.

Circuit terminals are disposed on the inner bottom surface of the recess in package body 7, and IC terminals of IC chip 1 are bonded to the circuit terminals through ultrasonic thermo-compression bonding using bumps 6, thereby securing IC chip 1 to the inner bottom surface of the recess. A pair of crystal holding terminals 12 are disposed on the top surface of the step on the inner wall of the recess, and crystal blank 8 is secured to crystal holding terminals 12 with conductive adhesive 13. Consequently, crystal blank 8 is positioned and held above IC chip 1 in the recess. Mounting terminals 4 are disposed at four corners on the outer bottom surface of package body 7, and mounting terminals 4 are electrically connected to the circuit terminals in a manner similar to the bonding type crystal oscillator described above. Crystal holding terminals 12 are also electrically connected to the circuit terminals through conductive paths, not shown.

In such a one-chamber type crystal oscillator, since IC chip 1 is also hermetically sealed within the recess of package body 7, no under-fill is provided for protecting the circuit forming surface of IC chip 1. Accordingly, the one-chamber type crystal oscillator has such advantages as the ability to eliminate detrimental effects due to thermal shrinkage after the under-fill is cured.

As described above, either the bonding type surface mount crystal oscillator or the one-chamber type surface mount crystal oscillator have their respective advantages, but stated another way, the bonding type one has a problem caused by the under-fill, while the one-chamber type has a problem of a lower productivity.

When the under-fill is provided for protecting the circuit forming surface of IC chip 1, the under-fill is formed by injecting a liquid protection resin, and thermally curing the protection resin. However, such under-fill exhibits large hygroscopic effects after the thermal curing, so that moisture within the under-fill is thermally expanded due to heating caused by, for example, reflow soldering for mounting the crystal oscillator on the wiring board, resulting in cracks and the like on an interface on which the bumps are bonded to the circuit terminals, and on an interface on which the bumps are bonded to the IC terminals. Thus, the bonding type is susceptible to adverse effects such as cracks caused by the under-fill. On the other hand, the one-chamber type crystal oscillator is fabricated by first securing IC chip 1 to the inner bottom surface of the recess, and then securing crystal blank 8, so that if a defect is found after crystal blank 8 has been secured, expensive IC chip 8 must be also discarded together, resulting in a lower productivity.

SUMMARY OF THE INVENTION

It is an object of the present invention to provide a surface mount crystal oscillator which has the advantage of the bonding type as well as the advantage of the one-chamber type, and is capable of eliminating the need for under-fill to improve the productivity.

The object of the invention is achieved by a surface mount crystal oscillator which includes a package body having a recess and formed with a step on an inner wall of the recess, a flat base plate having a peripheral region secured to the step, a crystal blank secured to the flat base plate, an IC chip having an oscillation circuit integrated therein, and secured to a bottom surface of the recess, the oscillation circuit using the crystal blank, and a cover for closing the recess, wherein the crystal blank is disposed above the IC chip within the recess, and the IC chip and the crystal blank are hermetically sealed within the recess.

In the configuration as described above, since the crystal blank is not directly secured to the perimeter of the recess but the crystal blank is secured to the flat base plate so that the flat base plate holds the crystal blank, the crystal blank can be tested to measure the oscillation characteristics as a crystal element before the flat base plate is secured to the package body to which the IC chip has already been secured. Since the crystal blank can be determined as to whether nor not it is acceptable as a crystal element at this time, the expensive IC chip will not be consumed for nothing even if the crystal blank is not acceptable as a crystal element, making it possible to increase the productivity. Also, since the IC chip and crystal blank are hermetically sealed within the package body, no under-fill for protecting the IC chip can be made unnecessary, thus eliminating detrimental effects which would otherwise caused by the under-fill.

Also, in the present invention, the flat base plate may include an opening formed through a central region thereof, and the crystal blank may be disposed between the flat base plate and IC chip in the recess, such that one of the excitation electrodes of the crystal blank exposes through the opening. With the employment of such a configuration, this opening can be used as a mask for an ion beam when the oscillation frequency is adjusted by utilizing a mass load effect for the crystal blank, so that the flat base plate-eliminates the need for a mask separately provided for adjustments to improve the productivity.

DETAILED DESCRIPTION OF THE PREFERRED EMBODIMENTS

Figure 1:
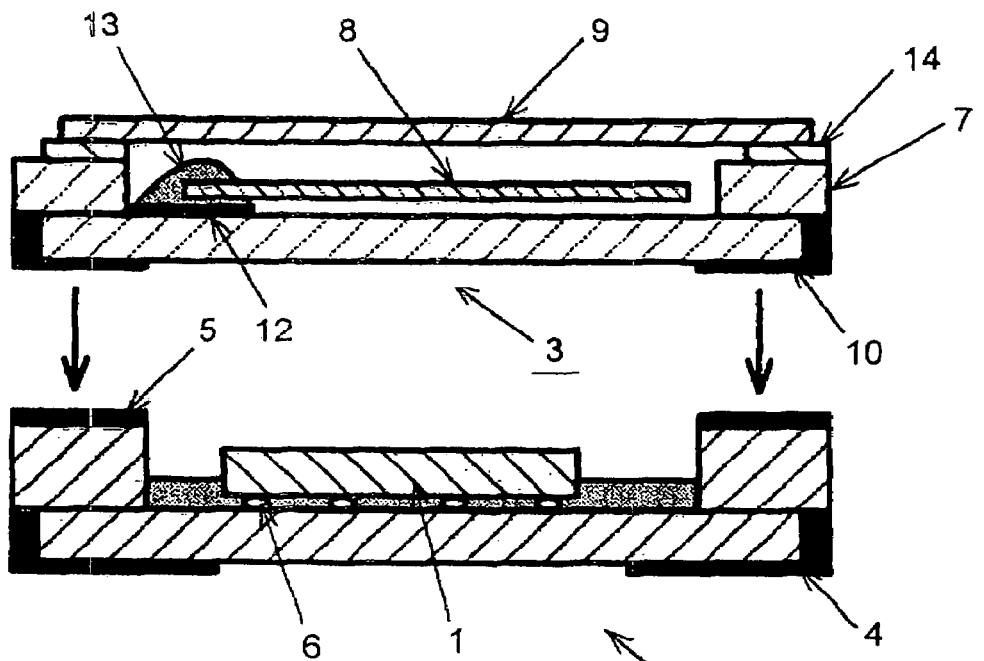
FIG. 1 is a cross-sectional view illustrating the configuration of a conventional one-chamber type surface mount crystal oscillator.
Figure 2:
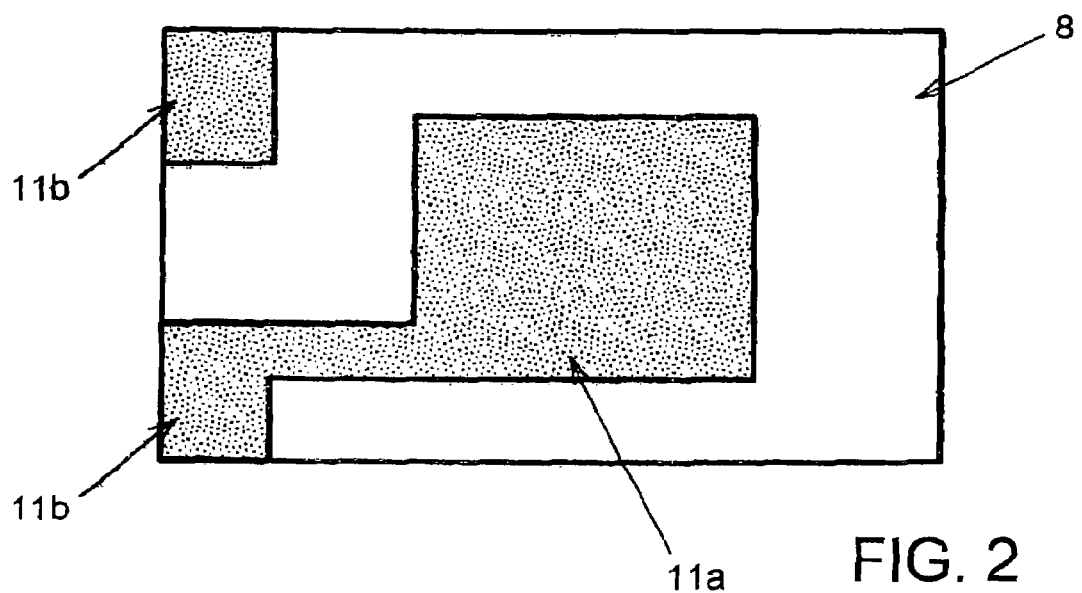
FIG. 2 is a plan view illustrating a crystal blank.
Figure 3:
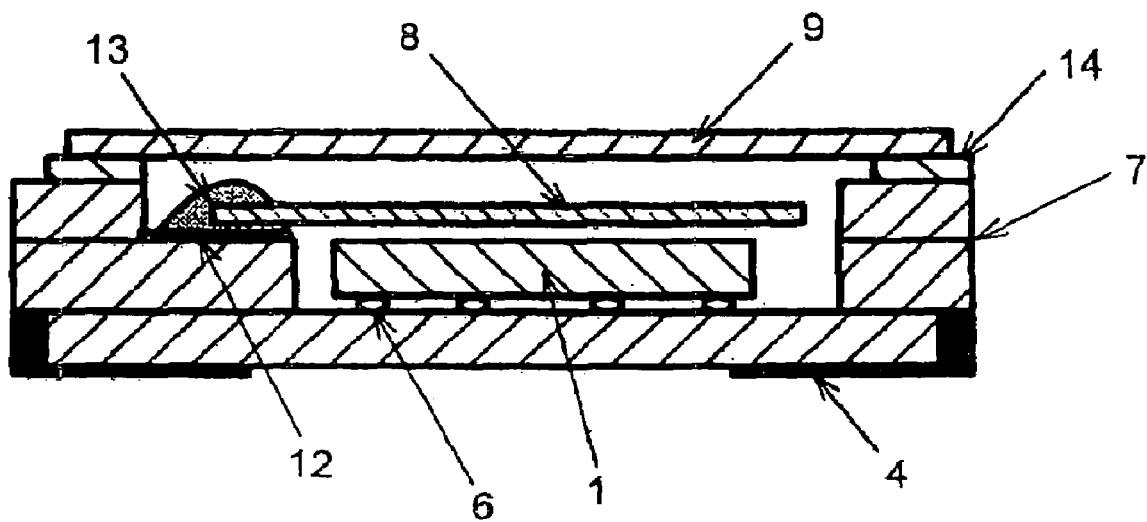
FIG. 3 is a cross-sectional view illustrating the configuration of a conventional bonding type surface mount crystal oscillator.
Figure 4A:
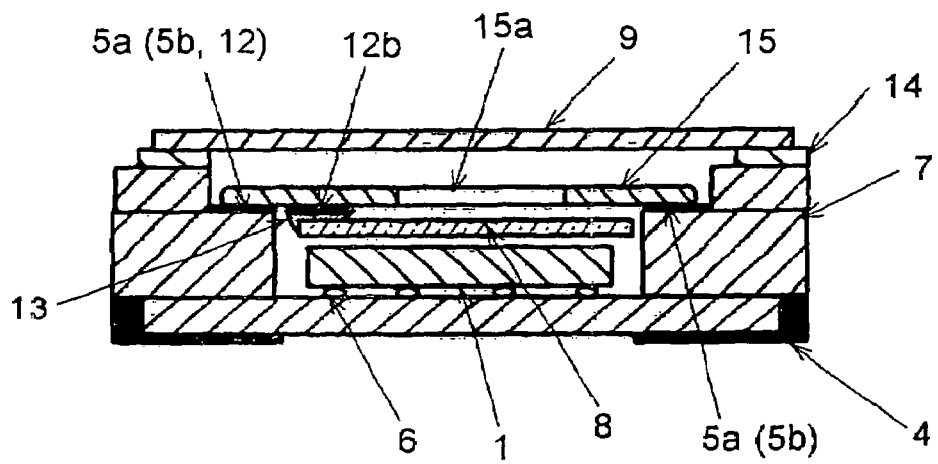
FIG. 4A is a cross-sectional view illustrating a surface mount crystal oscillator according to one embodiment of the present invention.
Figure 4B:
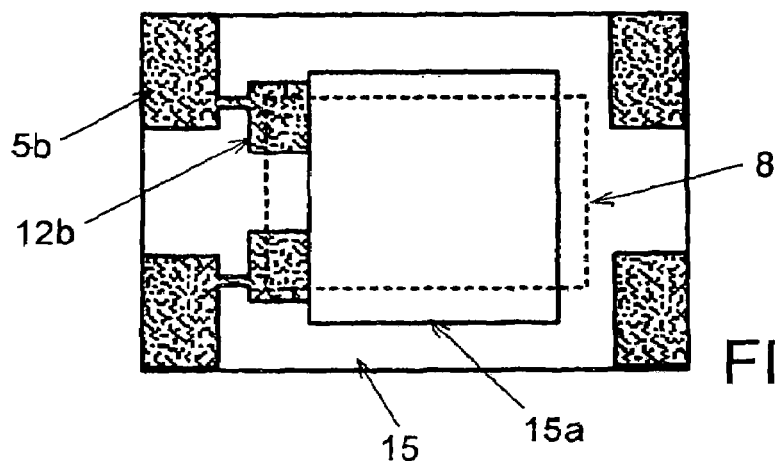
FIG. 4B is a plan view illustrating a flat base plate.
Figure 4C:
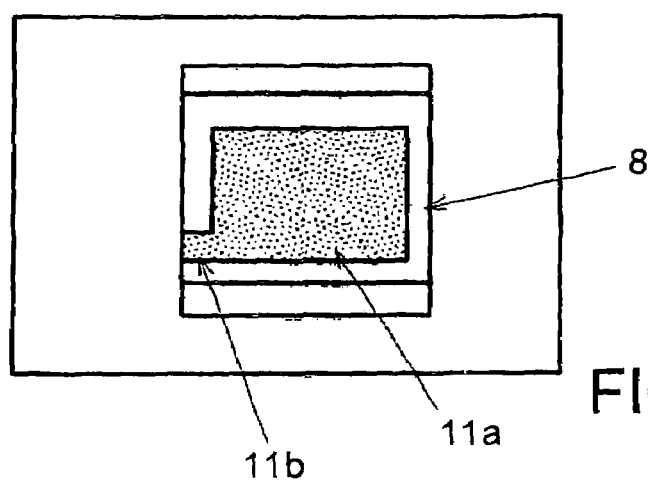
FIG. 4C is a plan view of the flat base plate when a crystal blank is attached to the back side thereof.

In FIGS. 4A to 4C which illustrate a surface mount crystal oscillator according to one embodiment of the present invention, the same components as those in FIGS. 1 to 3 are designated the same reference numerals, and repeated descriptions will be omitted.

The surface mount crystal oscillator illustrated in FIGS. 4A to 4C employs package body 7 which has a recess with steps formed on inner walls thereof, and comprises IC chip 1 and quartz crystal blank 8 accommodated within the recess, and a metal cover 9 which is placed on an open end surface surrounding the recess to hermetically seal IC chip 1 and crystal blank 8 within the recess. As illustrated in FIG. 4A, the steps are formed on inner walls which correspond to two opposing sides of package body 7 in the recess. While it can be said that this crystal oscillator belongs to the one-chamber type from the fact that IC chip 1 and crystal blank 8 are sealed within the single recess, the crystal oscillator differs from conventional one-chamber type crystal oscillators in that crystal blank 8 is not directly secured to the steps in the recess. As will be later described, crystal blank 8 is secured to flat base plate 15, and this flat base plate 15 is held on the steps of the recess, such that crystal blank 8 is held in the recess.

Circuit terminals, similar to those listed above, are disposed on the inner bottom surface of the recess, and IC terminals of IC chip 1 are bonded to these circuit terminals through ultrasonic thermo-compression bonding using bumps 6, to secure IC chip 1 to the inner bottom surface of the recess such that a circuit forming surface faces the inner bottom surface of the recess.

First bonding terminals 5a are formed at positions of four corners on the top surfaces of the steps, when package body 7 is viewed from above. Among four pieces of first bonding terminals 5a, two terminals positioned on one side of package body 7 correspond to a pair of crystal holding terminals disposed on the top surface of the recess in the conventional crystal oscillator illustrated in FIG. 3, and are electrically connected to those which correspond to connection terminals among the circuit terminals.

FIG. 4B illustrates a main surface of flat base plate 15 which faces IC chip 1, and FIG. 4C illustrates the other main surface of flat base plate 15 when flat base plate 15 is held on the steps of the recess.

Flat base plate 15 is a substantially rectangular plate-like member which is made of an insulating material, preferably, a ceramic material. Flat base plate 15 is sized such that its both opposing sides can come into contact with the top surfaces of the respective steps on both opposing sides of the recess. Flat base plate 15 is formed with opening 15a in a central region, extending through both main surfaces of flat base plate 15. Second bonding terminals 5b are formed at corners on the surface of flat base plate 15 in correspondence to first bonding terminals 5a. Among these four pieces of second bonding terminals 5b, two positioned on one side of flat base plate 15 are used for electric connection with crystal blank 8. These two pieces of second bonding terminals 5b are electrically connected to a pair of holding terminals 12b which are disposed along one side of opening 15a on the surface of flat base plate 15.

Crystal blank 8 has both ends of one side, to which lead-out electrodes 11b are extended, secured to holding terminals 12b with conductive adhesive 13 or the like. Then, first bonding terminals 5a formed on the steps on the inner walls of the recess are bonded to second bonding terminals 5b formed on flat base plate 15 by soldering, thereby fixing flat base plate 5 in the recess, and positioning and holding crystal blank 8 above IC chip 1. In this event, flat base plate 15 has its peripheral region secured to both steps. Crystal blank 8 is electrically connected to an oscillation circuit within IC chip 1 through holding terminals 12b, second contact terminals 5b, first contact terminals 5a, and circuit terminals. In this event, before metal cover 9 is bonded, one excitation electrode 11a of crystal blank 8 exposes through opening 15a of flat base plate 15.

Next, a description will be given of processes of manufacturing the crystal oscillator.

Assume that IC chip 1 has been previously secured to the inner bottom surface of package body 1. First, both ends of the one side of crystal blank 8, to which lead-out electrodes 11b extend, are secured to holding terminals 12b of flat base plate 15 with conductive adhesive 13. Then, a probe is brought into contact with second contact terminals 5b which are electrically connected to crystal blank 8 to test crystal blank 8 for oscillation characteristics as a crystal element. At this stage, defective crystal blank 8, if any, is removed. Subsequently, the surface of flat base plate 15, i.e., the surface to which crystal blank 8 is secured, is oriented to oppose the steps of the inner walls in package body 7 to which IC chip 1 is secured, and first contact terminals 5a on the steps of the inner walls are connected to second connection terminals 5b on flat base plate 15 by soldering.

As a result, crystal blank 8 is positioned between flat base plate 15 and IC chip 1, and one excitation electrode 11a exposes through opening 15a of flat base plate 15. Next, the crystal oscillator is operated, and excitation electrode 11a is irradiated, for example, with an ion beam from an ion gun for adjusting the oscillation frequency. As excitation electrode 11a is irradiated with the ion beam, excitation electrode 11a is sputter-etched and reduced in mass, causing an associated change in the oscillation frequency of crystal blank 8 from a lower frequency to a higher frequency. As such, the crystal oscillator is adjusted such that its oscillation frequency falls within a desired specified range by continuously irradiating the ion beam while observing the oscillation frequency of the crystal oscillator. Finally, metal cover 9 is bonded to the open end surface of the recess in package body 7 by seam welding to hermetically seal IC chip 1 and crystal blank 8 within the recess, thus completing the crystal oscillator.

The surface mount crystal oscillator of this embodiment described above basically belongs to the one-chamber type, and requires no under-fill for protecting IC chip 1 because IC chip 1 and crystal blank 8 are hermetically sealed within the recess. It is therefore possible to eliminate detrimental effects such as cracks on the bonding interfaces due to hygroscopic effects of the under-fill. In addition, since crystal blank 8 can be tested for oscillation characteristics while it is secured to flat base plate 15, before crystal blank 8 is contained in package body 7, and any crystal blank can be removed from subsequent steps if it is determined as defective in this test. Accordingly the productivity can be improved without discarding expensive IC chip 1. In this connection, the oscillation characteristics of the crystal element should be evaluated including a holding system for holding or securing the crystal blank, and no determination can be made as to whether or not the oscillation characteristics are acceptable even if the crystal blank alone is tested. In this embodiment, crystal blank 8 is secured to flat base plate 15 so that the oscillation characteristics are determined to be acceptable or not depending on how crystal blank 8 is secured. It is possible to basically neglect the influence exerted on the oscillation characteristics by a manner in which flat base plate 8 is secured to the steps.

In this embodiment, since excitation electrode 11a of crystal blank 8 exposes through opening 15a formed through a central region of flat base plate 15, flat base plate 15 can be additionally used as a mask for an ion beam during adjustments of the oscillation frequency. This double use of flat base plate 15 eliminates the need for a mask independently used for frequency adjustments, and ancillary positioning operations therefor, to improve the workability.

Figure 5:
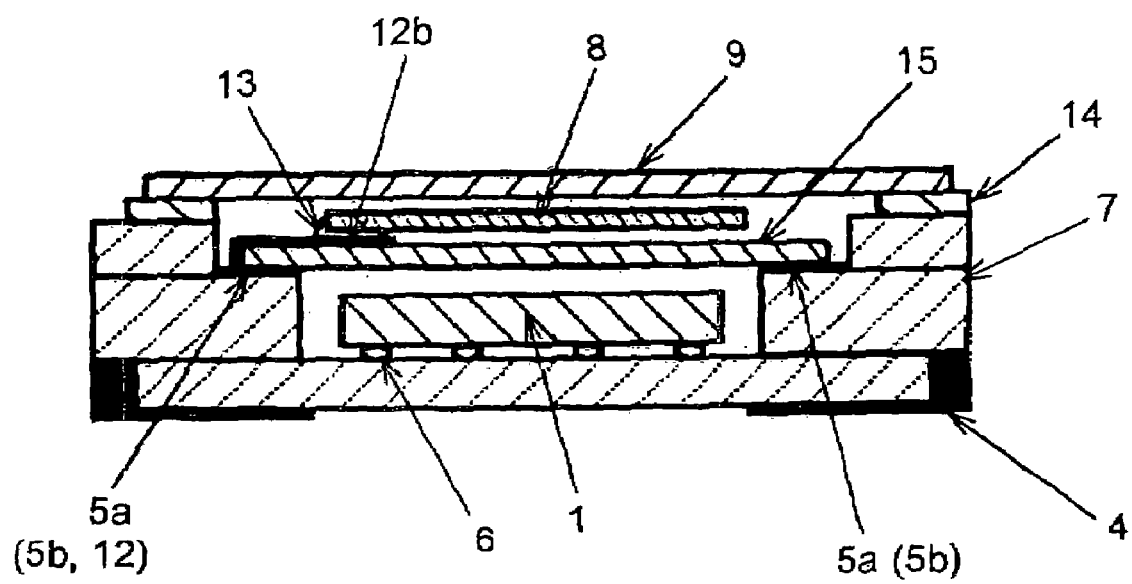
FIG. 5 is a cross-sectional view illustrating the configuration of a surface mount crystal oscillator according to another embodiment of the present invention.

In the crystal oscillator described above, crystal blank 8 is disposed between flat base plate 15 and IC chip 1, but the crystal oscillator of the present invention is not limited to this particular arrangement. For example, as illustrated in FIG. 5, crystal blank 8 may be disposed between flat base plate 15 and metal cover 9. In this alternative arrangement, flat base plate 15 is also bonded to the steps formed on the inner walls of the recess on both sides. In this arrangement, flat base plate 15 need not be provided with opening 15a therethrough, but a mask is separately required to narrow down the ion beam when the oscillation frequency is adjusted. Therefore, from a viewpoint of whether or not a separate mask is required during adjustments, the configuration illustrated in FIGS. 4A to 4C is more advantageous than the configuration illustrated in FIG. 5.

What is claimed is:

1. A surface-mount crystal oscillator, comprising:
   a package body having a recess and formed with a step on an inner wall of the recess;
   a flat base plate having a peripheral region secured to the step;
   a crystal blank secured to said flat base plate;
   an IC chip having an oscillation circuit integrated therein, and secured to a bottom surface of the recess, said oscillation circuit using said crystal blank;
   a cover for closing the recess, wherein said crystal blank is disposed above said IC chip within the recess, and said IC chip and said crystal blank are hermetically sealed within the recess;
   a pair of excitation electrodes disposed respectively on both main surfaces of said crystal blank; and
   a pair of lead-out electrodes extended respectively from said excitation electrodes to both ends of one side of said crystal blank, wherein said crystal blank is secured to said flat base plate along a peripheral region thereof to which said lead-out electrodes are extended and wherein said flat base plate includes an opening formed through a central region thereof to expose one of said excitation electrodes, and said crystal blank is disposed between said flat base plate and said IC chip in the recess.

2. The crystal oscillator according to claim 1, further comprising:
   a pair of holding terminals disposed on a surface of said flat base plate, wherein said crystal blank is held on said flat base plate by electrically and mechanically connecting both ends of the one side of said crystal blank to said holding terminals with a conductive adhesive.

* * * * *